(12) United States Patent
Higashikawa (10) Patent No.: US 7,071,081 B2
(45) Date of Patent: Jul. 4, 2006

(54) METHOD OF FORMING SEMICONDUCTOR DEVICE

(75) Inventor: Makoto Higashikawa, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 90 days.

(21) Appl. No.: 10/834,836

(22) Filed: Apr. 30, 2004

(65) Prior Publication Data

US 2004/0266143 A1     Dec. 30, 2004

(30) Foreign Application Priority Data

May 7, 2003   (JP) ............................. 2003-129063

(51) Int. Cl.
*H01L 21/20* (2006.01)
(52) U.S. Cl. .................................... 438/478
(58) Field of Classification Search ................ 438/692, 438/690, 618, 478; 136/249
See application file for complete search history.

(56) References Cited

U.S. PATENT DOCUMENTS

| | | | |
|---|---|---|---|
| 4,400,409 A | 8/1983 | Izu et al. ...................... 427/39 |
| 5,589,007 A * | 12/1996 | Fujioka et al. ............... 136/249 |
| 5,981,934 A | 11/1999 | Higashikawa ........... 250/214 R |
| 6,252,158 B1 | 6/2001 | Higashikawa ............... 136/258 |
| 6,472,248 B1 | 10/2002 | Shiozaki et al. .............. 438/97 |
| 6,706,336 B1 | 3/2004 | Kondo et al. ............... 427/588 |
| 2002/0117661 A1 | 8/2002 | Kondo et al. ................. 31/100 |

FOREIGN PATENT DOCUMENTS

JP     2002-170973     6/2002

* cited by examiner

*Primary Examiner*—Carl Whitehead, Jr.
*Assistant Examiner*—Monica D. Harrison
(74) *Attorney, Agent, or Firm*—Fitzpatrick, Cella, Harper & Scinto (57) ABSTRACT

The present invention provides a method of forming a semiconductor device that has a plurality of pin junctions comprising silicon films formed on a substrate by using a radio-frequency plasma CVD method, including: forming a first semiconductor layer; covering a surface of the first semiconductor layer with a member containing water with a content of 0.01 to 0.5 wt % so as to contact each other; removing the member; and forming a second semiconductor layer on the first semiconductor layer. According to the present invention, it is possible to efficiently form a semiconductor device having a multi-layer structure where a number of silicon thin films are laminated, to form a semiconductor device having less variation in characteristics among lots and having more excellent uniformity and characteristics, and to provide a semiconductor device excelling in adhesion and environmental resistance.

10 Claims, 4 Drawing Sheets

METHOD OF FORMING SEMICONDUCTOR DEVICE

BACKGROUND OF THE INVENTION

1. Field of the Invention

The present invention relates to a method of forming a semiconductor device.

2. Related Background Art

A radio-frequency (RF) plasma CVD method facilitates formation of a device with a large area or at a low temperature and thus has an advantage in that a process throughput is improved. Therefore, the method is regarded as promising as a method of forming a silicon thin film.

Taking a solar cell as an example of a semiconductor device having a semiconductor junction composed of silicon thin films, the solar cell formed of the silicon thin films is advantageous in terms of inexhaustible energy source and clean power generation process as compared with existing energy utilizing fossil fuels. However, the solar cell needs to, for its widespread use, attain a lower unit price per generated power. To that end, significant technical issues to consider are as follows: establishment of a producing technique capable of realizing a low cost, a technique of enhancing a photoelectric conversion efficiency, a technique regarding a uniformity for forming semiconductor devices having desired characteristics in a stable manner, and a technique of improving an environmental resistance in consideration of actual use conditions (in many cases, the solar cell is placed outdoors).

As a method of producing the semiconductor device having the semiconductor junction composed of the silicon thin films, there have been known a method of sequentially forming semiconductor layers of desired conductivity types in a single semiconductor forming vessel, and a so-called batch method in which a p-type layer, an i-type layer, and an n-type layer are formed in separate semiconductor forming vessels for preventing an impurity gas from mixing therein, and the like. In addition, disclosed in U.S. Pat. No. 4,400,409 as a production method capable of avoiding mixing of impurities and realizing cost reduction is a continuous plasma CVD method employing a roll to roll system. From the viewpoint of further improving characteristics and productivity, Japanese Patent Application Laid-Open No. 2002-170973 discloses a method of forming a semiconductor device characterized by including the step of exposing a semiconductor layer to an oxygen atmosphere at a semiconductor interface.

The disclosed RF plasma CVD method is an excellent semiconductor device forming method. However, in the case of including plural pin junctions and using a multi-layer structure of the p-type layer, the i-type layer, and the n-type layer, the method involves the increased number of requisite semiconductor forming vessels. Suppose a case where all the semiconductor forming vessels are continuously connected with one another to continuously form the semiconductor layers in a step of forming the semiconductor device. In such a case, an operation of the entire system needs to be stopped each time the need for maintenance, inspection, or repair arises in part of the semiconductor forming vessels. Further, when taking out it to the outside (in the air) midway through the semiconductor formation, lots may vary from one another in their characteristics, in particular, photoelectric conversion efficiencies, although depending on deposition conditions, environmental conditions, or storage conditions.

SUMMARY OF THE INVENTION

The present invention has an object to provide a method of forming a semiconductor device, which enables efficient formation of a semiconductor device having a multi-layer structure where a number of silicon thin films are laminated, a method of forming a semiconductor device having less variation in characteristics among lots and having more excellent uniformity and characteristics, and a method of forming a semiconductor device excelling in adhesion and environmental resistance.

The present invention provides a method of forming a semiconductor device that has a plurality of pin junctions comprising silicon films formed on a substrate using a radio-frequency plasma CVD method, the method comprising, in sequence: a first formation step for forming a first semiconductor layer; a covering step for covering a surface of the first semiconductor layer with a member containing water content of 0.01 to 0.5 wt % so as to contact each other; a removing step for removing the member; and a second formation step for forming a second semiconductor layer on the first semiconductor layer.

In the method according to the present invention, preferably, the member is brought into contact with the surface of the first semiconductor layer at a pressure of 10 $g/cm^2$ to 100 $g/cm^2$, more preferably 20 $g/cm^2$ to 80 $g/cm^2$.

In the method according to the present invention, preferably, the surface of the first semiconductor layer has a higher temperature in the covering step than a temperature of the surface of the first semiconductor layer in the removing step and the temperature of the surface is gradually decreased between the covering step and the removing step.

In the method according to the present invention, preferably, the method further includes a keeping step for keeping the device in the air at at least a part between the covering step and the removing step. It is preferable that the covering step be performed in a vacuum and then the substrate on which the first semiconductor layer has been formed and the surface of the semiconductor has been covered with the member, be kept in the air and that the removing step be performed in a vacuum. However, the covering step and the removing step may be performed in the air. Further, the substrate on which the first semiconductor layer has been formed and the surface of the semiconductor has been covered with the member, is preferably kept in a dry nitrogen atmosphere. Also, the substrate on which the first semiconductor layer has been formed and the surface of the semiconductor has been covered with the member, is preferably kept in an airtight space.

In the method according to the present invention, preferably, the member is formed of nonwoven cloth.

According to a preferable aspect of the present invention, the first semiconductor layer is formed of a semiconductor having one conductivity type and the second semiconductor layer is formed of a semiconductor having another conductivity type different from the one conductivity type or the first semiconductor layer and the second semiconductor layer are formed of semiconductors having the same conductivity type.

According to another preferable aspect of the present invention, the radio-frequency plasma CVD method includes a roll to roll method.

According to the present invention, it is possible to efficiently form a semiconductor device having a multi-layer structure where a number of silicon thin films are laminated, having less variation in characteristics among lots and having more excellent uniformity and characteristics, and to form a semiconductor device excelling in adhesion and environmental resistance.

DESCRIPTION OF THE PREFERRED EMBODIMENTS

Hereinafter, preferred embodiments of the present invention are described but the present invention is not limited to those embodiments.

In a roll to roll method, aramid paper or a PET film has been used so far, for example, for separating a substrate. When taking out it to the outside (in the air) midway through semiconductor formation, lots may vary in their characteristics, in particular, photoelectric conversion efficiencies, although depending on deposition conditions, environmental conditions, or storage conditions. The inventor of the present invention have made extensive studies and finally found that the variation in photoelectric conversion efficiency correlates to a water content of a member covering a semiconductor surface, which content is influenced by a treating method for the member or the way of handing a roll. This is supposedly because the water from the member for separating the substrate affects the surface of a semiconductor layer.

To that end, a semiconductor device is half-completed by using aramid paper "NOMEX" (available from Du Pont Co.) having a thickness of 0.05 mm as a member and a water content changed according to a procedure described later with reference to FIGS. 1A, 1B, 1C, 1D and 1E. The half-completed device is left standing a day in an airtight space under a dry nitrogen atmosphere, followed by completing the whole semiconductor device. As a result, in some regions, the photoelectric conversion efficiency largely varies depending on the water content of the member. If the water content is larger than 0.5%, it is likely that the photoelectric conversion efficiency falls and the variation in photoelectric conversion efficiency among the lots increases. If the water content is smaller than 0.01%, the variation in photoelectric conversion efficiency among the lots tends to increase.

The cause of the variation in photoelectric conversion efficiency is not specifically known. However, the variation is supposed to occur owing to: an effect of a fine oxygen atom layer suppressing diffusion of dopants, the oxygen atom layer being formed at a semiconductor layer interface as appropriate; and modification of a semiconductor layer due to adsorption of the water in the semiconductor layer or due to bonding thereof. Note that if the water content is excessively increased, the semiconductor layer is further modified, leading to an increase in series resistance and reduction in fill factor (hereinafer, referred to as FF). As a result, the photoelectric conversion efficiency may fall and vary. In contrast, with the small water content, it is found that the member has an increased stiffness and cannot come into uniform contact with the semiconductor surface. This supposedly causes the non-uniform formation of the modified semiconductor layer and increases the variation in photoelectric conversion efficiency.

As presumed from the above, the variation in photoelectric conversion efficiency is induced unless the uniform contact is attained. According to the findings of the inventor of the present invention, a pressure at which the member contacts the semiconductor layer preferably ranges from 10 $g/cm^2$ to 100 $g/cm^2$.

According to the present invention, it is preferable that the surface of the first semiconductor layer have a higher temperature in the covering step for covering the surface of the first semiconductor layer with the member so as to contact each other than a temperature of the surface of the first semiconductor layer in the removing step for removing the member and the temperature of the surface be gradually decreased between the two steps. The higher the temperature, the more easily the reaction proceeds. Also, the reaction itself slows down as the reaction proceeds. Therefore, in the case where the temperature is high immediately after the layer contacts the member and is gradually decreased afterward, the semiconductor layer is modified at a rather high rate at the beginning and is then gradually modified according as the temperature decreases and the thickness increases. As a result, the uniform thickness may be attained with few irregularities and the variation in photoelectric conversion efficiency may be lessened. In addition, the above is assumed to relax a stress that acts on the interface, improving an adhesion therebetween.

According to the present invention, more stable conditions are achieved under storage in a reduced pressure atmosphere, for example, in a vacuum. Meanwhile, an apparatus for keeping the vacuum atmosphere is necessary, for instance. By inserting the step of keeping the device in the air at at least one point between the covering step for covering the first semiconductor surface with the member so as to contact each other and the removing step for removing the member, a part of pin junction is formed in the semiconductor device as needed and the device can be kept in an apparatus any maintenance of which is omitted. Therefore, its productivity can be enhanced in total. Also, plural semiconductor forming apparatuses are prepared and thus the semiconductor layers with high maintenance frequency are formed by the greater number of semiconductor forming apparatuses. The productivity can be further enhanced. At this time, if the device is kept in a dry nitrogen atmosphere or an airtight space, the environmental conditions such as temperature conditions are more stabilized, which leads to the small variation in the photoelectric conversion efficiency. Accordingly, the device is preferably kept in the dry nitrogen atmosphere, more preferably the airtight space.

The member may be formed of, for example, fibrous non-woven cloth or resins such as polyethylene, polyester, PET, polyimide, and polyamide. Among those, the non-woven cloth is a preferred material in terms of appropriate water retention.

Consider a case where the first semiconductor layer is formed of a semiconductor having one conductivity type and the second semiconductor layer is formed of a semiconductor having another conductivity type different from the one conductivity type. For example, the first semiconductor layer is constituted of a p-type layer and the second semiconductor layer is constituted of an n-type layer. Alternatively, the first semiconductor layer is constituted of the n-type layer and the second semiconductor layer is constituted of the p-type layer. In such a case, the interface constitutes a reverse junction, so that the photoelectric conversion efficiency falls if the device exhibits rectifying characteristics. Therefore, it is important to cause a current to flow through as many defects as possible, for example. In addition, excessive mutual-diffusion of the impurities needs to be suppressed for maintaining characteristics of the layer with the conductivity type. In the present invention, the modified semiconductor layer is formed, making it possible to attain the less mutual-dispersion of the impurities and the many defects in the interface. Therefore, the above effect is further exerted, which is preferable.

In a case where the first semiconductor layer and the second semiconductor layer are made of semiconductors with the same conductivity type, the semiconductor layer modified with the water is formed between the layers with the conductivity type. Thus, the modified layer can suppress the diffusion of the dopants into the first semiconductor layer even when appropriately increasing the dopant concentration of the dopants in the second semiconductor layer formed on the pn interface (pn junction) side. Also, the modified semiconductor layer is formed therein to thereby achieve a wide band gap and suppress absorption of incident light, which is preferable. The modified semiconductor layer has an effect of scattering the incident light and thus is expected to increase the amount of incident light absorbed in a light absorption layer.

A roll to roll method is cited as an example where the present invention is preferably applied.

Figure 1A:
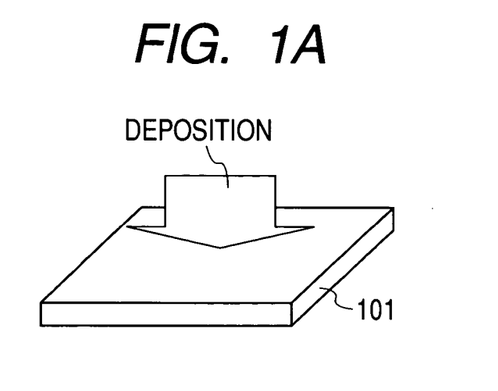
FIGS. 1A, 1B, 1C, 1D and 1E are schematic diagrams for illustrating a method of forming a semiconductor device according to an embodiment of the present invention.
Figure 1B:
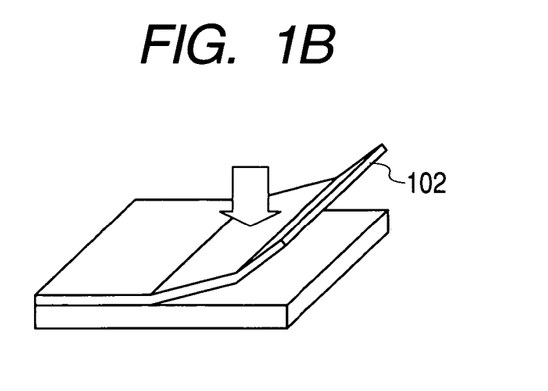
Figure 1C:
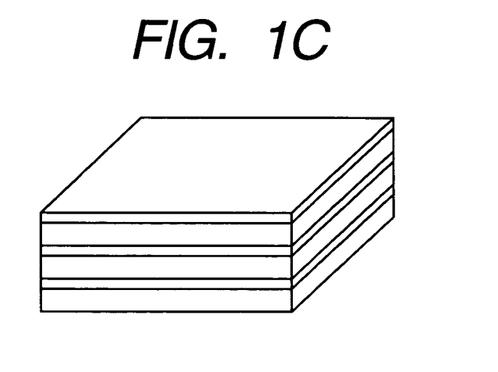
Figure 1D:
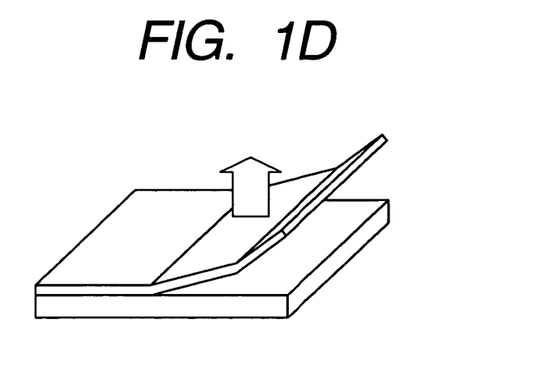
Figure 1E:
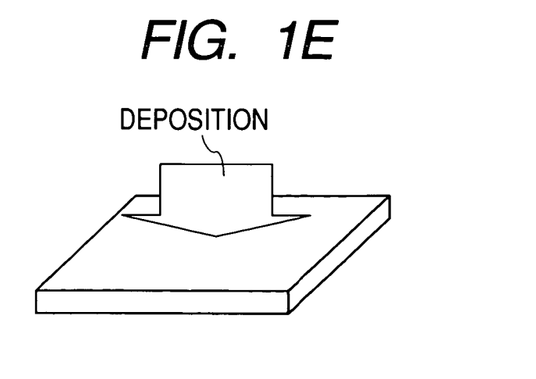

FIGS. 1A, 1B, 1C, 1D, and 1E each illustrate a method of forming a semiconductor device according to an embodiment of the present invention. In FIGS. 1A, 1B, 1C, 1D and 1E, reference numeral 101 denotes a substrate and 102 denotes a member. In the present invention, the device is formed according to the following procedure:

(a) Up to the first semiconductor layer is formed on the substrate 101 (FIG. 1A).
(b) The substrate 101 formed up to the first semiconductor layer is made in contact with the member 102 such that the member 102 covers the substrate 101 (FIG. 1B).
(c) Storage is done in the state where the substrate 101 formed up to the first semiconductor layer is in contact with the member 102 (FIG. 1C). FIG. 1C shows the case where plural sets of the substrate 101 and the member 102 are laminated and storaged.
(d) The member 102 is removed from the substrate 101 formed up to the first semiconductor layer (FIG. 1D).
(e) The second semiconductor layer and the rest are formed on the substrate 101 formed up to the first semiconductor layer (FIG. 1E).

Figure 2A:
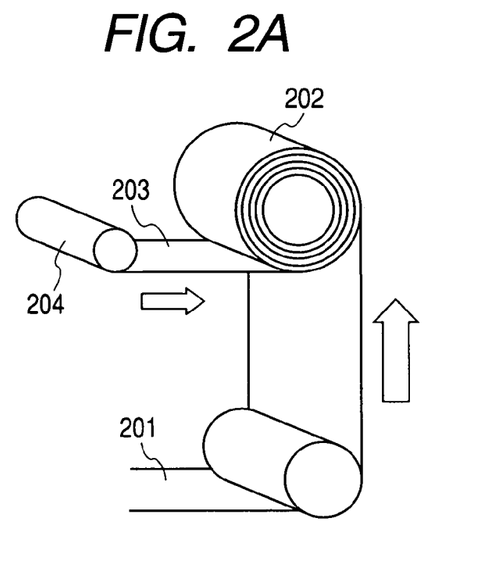
FIGS. 2A and 2B are schematic diagrams for illustrating a method of forming a semiconductor device according to another embodiment of the present invention.
Figure 2B:
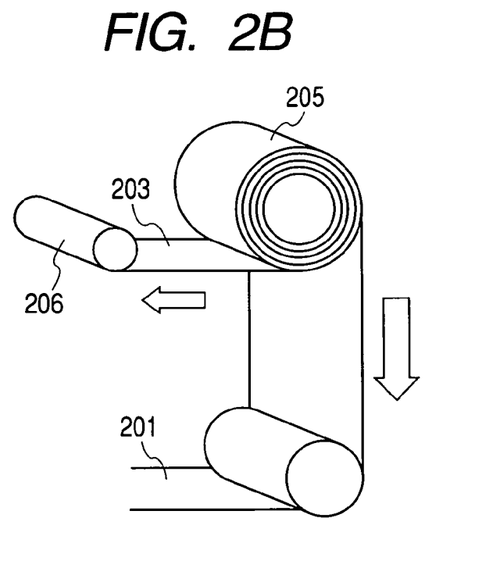

FIGS. 2A and 2B show an example of a case of using a flexible substrate.

FIG. 2A shows the step of covering the substrate with a member.

A member 203 is fed from a member feeding device 204 and taken up by a take-up bobbin 202 alternate with a flexible substrate 201. In this case, the flexible substrate 201 is wound under a tensile stress. The member 203 is pressed against the flexible substrate 201 at a given pressure. At this time, a pressure P for winding up the flexible substrate is represented by P=f/r/d, where f represents a tensile stress, r represents a radius, and d represents a width of the substrate.

Similarly, FIG. 2B shows the step of removing the member.

A member take-up device 206 rewinds and removes the member 203 from a feeding bobbin 205 around which the member and the flexible substrate 201 have been alternately wound. The flexible substrate is fed.

A photovoltaic device disclosed in Japanese Patent Application Laid-Open No. 2002-170973 is given as an example of a semiconductor device to which the formation method of the present invention is preferably applied.

In examples described hereinafter, the present invention is described in detail taking a solar cell as an example of the semiconductor device. However, those examples should not be construed as limiting the scope of the present invention.

EXAMPLE 1

Figure 3:
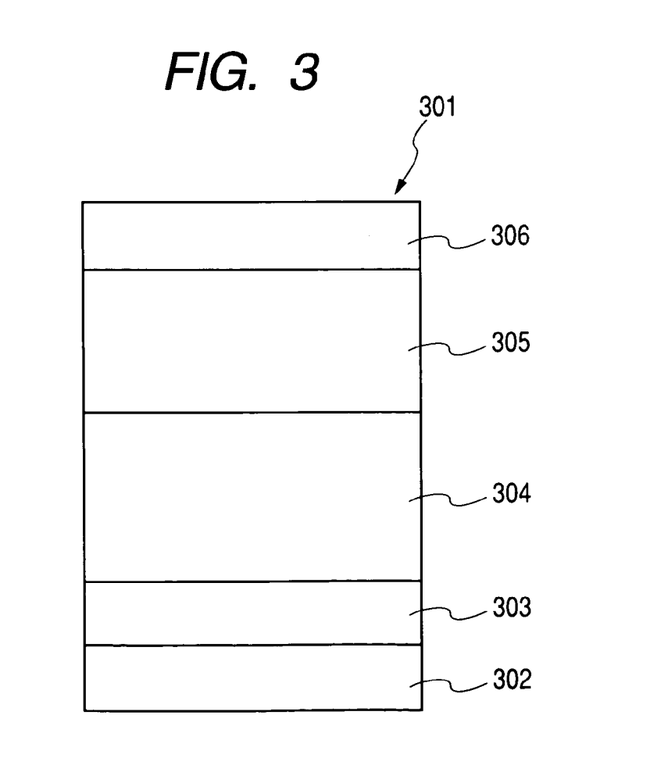
FIG. 3 is a schematic sectional view showing an example of a photovoltaic device including a semiconductor device, to which a formation method according to the present invention is preferably applicable.
Figure 4:
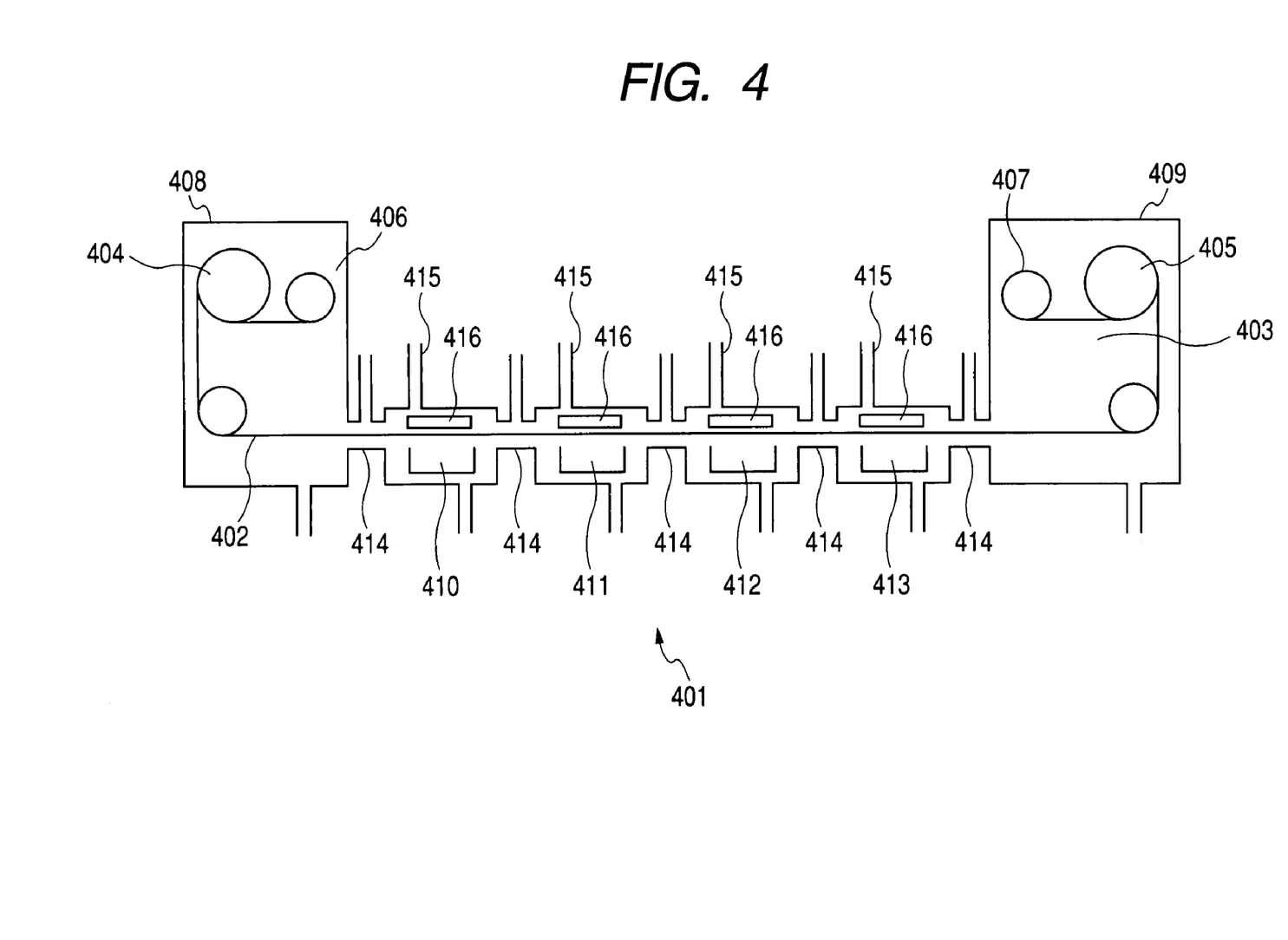
FIG. 4 is a schematic sectional view showing an example of a deposited film forming apparatus for forming a semiconductor device, to which the formation method according to the present invention is preferably applicable.

A photovoltaic device shown in FIG. 3 was formed using a deposited film forming apparatus 401 shown in FIG. 4 according to the following procedure. FIG. 3 is a schematic sectional view showing an example of a photovoltaic device 301 having a silicon thin film according to the present invention. In FIG. 3, reference numeral 302 denotes a substrate; 303, a reflective layer; 304, a photovoltaic device having a first pin junction; 305, a photovoltaic device having a second pin junction; and 306, a transparent electrode.

FIG. 4 is a schematic sectional view showing an example of a deposited film forming apparatus for forming a silicon thin film and manufacturing a photovoltaic device according to the present invention. The deposited film forming apparatus 401 of FIG. 4 is composed by connecting between a substrate feeding vessel 408, semiconductor forming vacuum vessels 410 to 413, and a substrate take-up vessel 409 through each gas gate 414. A band-shaped, conductive substrate 402 was set in the deposited film forming apparatus 401 while passing through the respective vessels and gas gates. The band-shaped, conductive substrate 402 was wound off from a feeding bobbin 404 installed in the substrate feeding vessel 408 and rewound around a take-up bobbin 405 in a substrate take-up vessel 409. At this time, the feeding bobbin 404 rewound the member 403 from a member take-up device 406. The take-up bobbin 405 rewound the member 403 from a member feeding device 407. The semiconductor forming vacuum vessels 410 to 413 were each composed of a deposition chamber for forming a plasma generating region and in addition, a heater 416 for heating the substrate 402.

A radio-frequency (RF) introducing portion (not shown) was applied with an RF power from an RF power source (not shown) to induce glow discharge to thereby decompose a material gas for allowing the semiconductor layer to deposit on the conductive substrate 402. Also, the semiconductor forming vacuum vessels 410 to 413 were each connected to a gas introducing pipe 415 for introducing the material gas or diluent gas and also to an exhaust system (not shown).

First, a band-shaped substrate made of stainless steel (SUS 430BA) (width: 50 cm, length: 1,500 m, and thickness: 0.125 mm) was well degreased and washed, and mounted to a continuous sputtering apparatus (not shown). Thus, Ag was deposited into a thin film with a thickness of 100 nm using an Ag electrode as a target through sputter deposition. Further, a ZnO thin film with a thickness of 2.0 μm was formed on the Ag thin film using a ZnO target through sputter deposition to form the band-shaped, conductive substrate 402.

Next, the feeding bobbin 404, around which the conductive substrate 402 had been wound, was attached to the substrate feeding vessel 408. The conductive substrate 402 was inserted up to the substrate take-up vessel 409 through the gas gate 414 at a carry-in side, the semiconductor forming vacuum vessels 410 to 413, and the gas gate 414 at a carry-out side. The tensile stress of 80 kg was applied to the band-shaped, conductive substrate 402 so as not to sag. The pressure varies along with an increase in radius. However, the substrate was wound at the pressure of about 20 to 60 g/cm².

At this time, the aramid paper "NOMEX" (available from Du Pont Co.) having a thickness of 0.05 mm and an adjusted water content was set on the member feeding device 407 and taken up by the take-up bobbin 405 together with the substrate 402. A vacuum pumping system including a vacuum pump (now shown) sufficiently evacuated the substrate feeding vessel 408, the semiconductor forming vacuum vessels 410 to 413, and the substrate take-up vessel 409 down to $6.7 \times 10^{-4}$ Pa ($5 \times 10^{-6}$ Torr) or less. The water content in the member was adjusted by controlling a time of drying in a 130° C.-oven.

The water content in the member was determined by cutting the member into fragments of 1.0 g each and measuring the water content in each fragment using a Karl Fischer moisture titrator "MKC-510" (manufactured by Kyoto Electronics Manufacturing Co., Ltd.). The measurements are listed in Table 1 below.

The material gas and the diluent gas were supplied to the semiconductor forming vacuum vessels 411, 412, and 413 from each gas introducing pipe 415 while operating the vacuum pumping system. An $H_2$ gas was simultaneously supplied as a gate gas to each gas gate 414 from each gate gas supplying pipe (not shown) at a flow rate of 500 sccm. In this state, the exhaust capacity of the vacuum pumping system was adjusted to adjust a pressure inside the semiconductor forming vacuum vessels 411, 412, and 413 to a predetermined pressure. The formation conditions are as listed in Table 2 below.

After the pressure inside the semiconductor forming vacuum vessels 411, 412, and 413 stabilized, the conductive substrate 402 started moving in a direction from the substrate feeding vessel 408 to the substrate take-up vessel 409.

Next, the glow discharge was induced inside the deposition chambers inside the semiconductor forming vacuum vessels 411, 412, and 413. An amorphous n-type semiconductor layer, a microcrystalline i-type semiconductor layer, and a microcrystalline p-type semiconductor layer were formed on the conductive substrate 402 to thereby form a pin junction of a bottom cell. After forming the p-type layer, the substrate was not forcedly cooled but brought into contact with the member and taken up by the take-up bobbin 405.

On completion of formation of the pin junction of the bottom cell, the substrate take-up vessel 409 underwent vacuum leak, and the conductive substrate 402 was taken out and kept for 24 hours in an airtight atmosphere under a dry nitrogen atmosphere until the deposited film forming apparatus 401 was ready for operation.

After that, a pin junction of a top cell was subsequently formed. The bobbin around which the conductive substrate 402 had been wound, was attached to the substrate feeding vessel 408. The conductive substrate 402 was inserted up to the substrate take-up vessel 409 through the gas gate 414 at a carry-in side, the semiconductor forming vacuum vessels 410 to 413, and the gas gate 414 at a carry-out side. The tensile stress of 80 kg was applied such that the band-shaped, conductive substrate 402 does not sag. Then, a vacuum pumping system including a vacuum pump (not shown) sufficiently evacuated the substrate feeding vessel 408, the semiconductor forming vacuum vessels 410 to 413, and the substrate take-up vessel 409 down to $6.7 \times 10^{-4}$ Pa ($5 \times 10^{-6}$ Torr) or less.

The material gas and the diluent gas were supplied to the semiconductor forming vacuum vessels 411, 412, and 413 from each gas introducing pipe 415 while operating the vacuum pumping system. An $H_2$ gas was simultaneously supplied from each gate gas supplying pipe (not shown) as a gate gas to each gas gate 414 at a flow rate of 500 sccm. In this state, the exhaust capacity of the vacuum pumping system was adjusted to adjust a pressure inside the semiconductor forming vacuum vessels 411, 412, and 413 to a predetermined pressure. The formation conditions are as listed in Table 3 below.

After the pressure inside the semiconductor forming vacuum vessels 411, 412, and 413 stabilized, the conductive substrate 402 started moving in a direction from the substrate feeding vessel 408 to the substrate take-up vessel 409.

Next, the glow discharge was induced inside the deposition chambers within the semiconductor forming vacuum vessels 411, 412, and 413. An amorphous n-type semiconductor layer, an amorphous i-type semiconductor layer, and a microcrystalline p-type semiconductor layer were formed on the conductive substrate 402 to thereby form the pin junction of the top cell.

Subsequently, the band-shaped photovoltaic device thus formed was processed into a solar cell module with a size of 36 cm×22 cm by using a continuous modularizing apparatus (not shown). In the same way, five samples (Examples 1-A to 1-C, and Comparative Examples 1-A and 1B) were prepared by changing the water content in the member. 1,000 modules were arbitrarily selected from among those prepared for each sample (10 lots per sample) and evaluated for current-voltage characteristics under the irradiation of light at a spectrum of AM 1.5 and intensity of 100 mW/cm² by using a solar simulator "YSS-150" (manufactured by Yamashita Denso K. K.). A photoelectric conversion efficiency ($\eta$ (%)) was obtained from the measured current-voltage characteristics. Further, the following cycle was repeated 100 times. That is, in the cycle, the module is first kept under conditions of 85° C. (temperature) and 85% (relative humidity) for 30 minutes and then cooled down to −20° C. in 70 minutes and kept for 30 minutes, and subsequently caused to return to the initial conditions of 85° C. (temperature) and 85% (relative humidity) in 70 minutes. After that, the adhesion was examined by using a cross-cut tape method (1 mm-interval between cuts and 100 squares).

Figure 5:
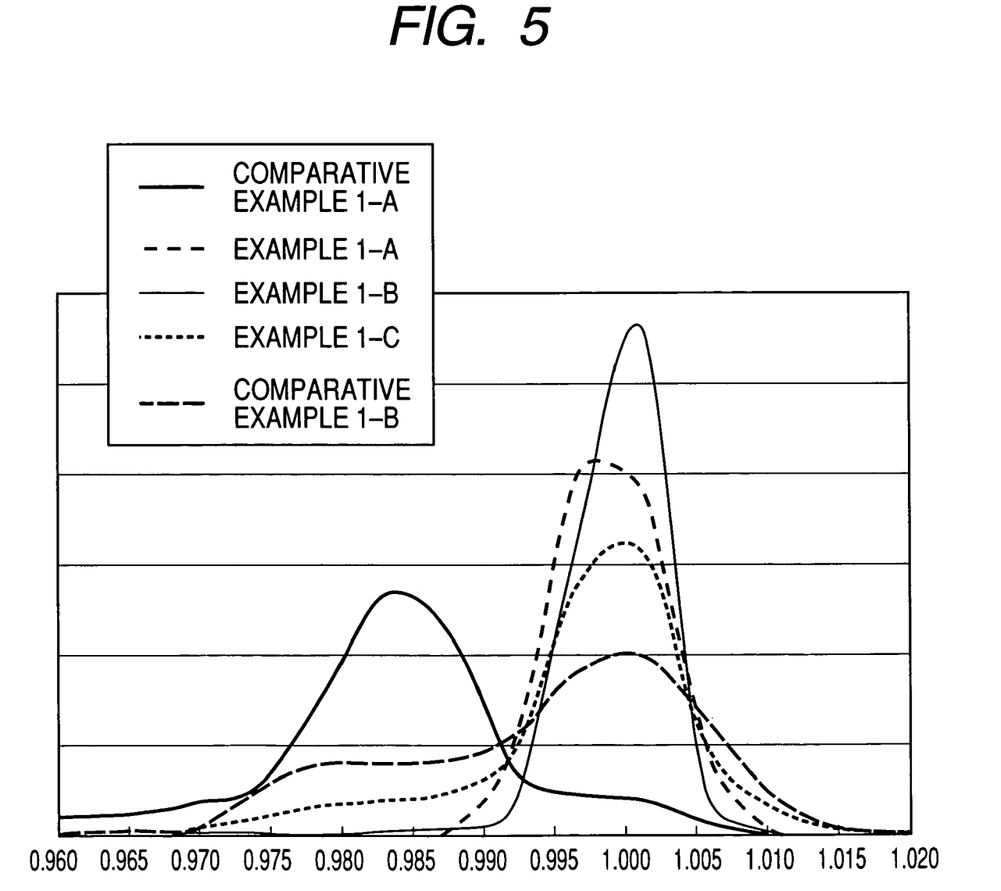
FIG. 5 is a graph illustrative of distribution regarding a photoelectric conversion efficiency of each photovoltaic device.

The results thereof are shown in FIG. 5 as relative values of the photoelectric conversion efficiency distribution with an average value of the modules of Example 1-B set as 1. In addition, the results are summarized in Table 5 below.

As shown in FIG. 5, the results reveal that Comparative Example 1-A involves slight decrease in average value of the photoelectric conversion efficiency and increase in variation of the photoelectric conversion efficiency. Examples 1-A to 1-C show almost the same distribution. Comparative Example 1-B involves the substantially similar average value but has a slight increase in variation of the photoelectric conversion efficiency. The measurements of the adhesion are as follows. In Examples 1-A to 1-C, and Comparative Example 1-A, the tape is peeled in 0 to 3 squares. In contrast, only in Comparative Example 1-B, the tape is peeled in a slightly large number of squares, i.e., 9 squares.

As understood from the above, when the water content falls within a range of 0.01% to 0.5%, the photoelectric conversion efficiency is satisfactory, the photovoltaic device with less variation in photoelectric conversion efficiency is obtained, and higher adhesion and environmental resistance are attained.

EXAMPLE 2

The photovoltaic device shown in FIG. 3 was formed using the deposited film forming apparatus 401 shown in FIG. 4 according to the following procedure.

The formation was conducted similar to Example 1 except using conditions of Tables 2 and 4 below.

The results are summarized in Table 6 below.

Comparative Example 1-A involves slight decrease in average value of the photoelectric conversion efficiency and increase in variation of the photoelectric conversion efficiency. Examples 1-A to 1-C show almost the same distribution. Comparative Example 1-B involves the substantially similar average value but has a slight increase in variation of the photoelectric conversion efficiency. The measurements of the adhesion are as follows. In Examples 1-A to 1-C, and Comparative Example 1-A, the tape is peeled in 0 to 4 squares. In contrast, only in Example 1-B, the tape is peeled in a slightly large number of squares, i.e., 11 squares.

As understood from the above, when the water content falls within a range of 0.01% to 0.5%, the photoelectric conversion efficiency is satisfactory, the photovoltaic device with less variation in photoelectric conversion efficiency is obtained, and higher adhesion and environmental resistance are attained.

TABLE 1

|  | Water content (wt %) |
|---|---|
| Comparative Example 1-A | 1.1 |
| Example 1-A | 0.5 |
| Example 1-B | 0.08 |
| Example 1-C | 0.01 |
| Comparative Example 1-B | 0.006 |

TABLE 2

| | Gas for film formation ($cm^3$/min(normal)) | | | Power | | Pressure (Pa) | Substrate temperature (° C.) | Film thickness (nm) |
|---|---|---|---|---|---|---|---|---|
| | $SiH_4$ | $H_2$ | $PH_3$ (diluted with 2% H) | $BF_3$ (diluted with 2% H) | density ($mW/cm^3$) RF | VHF | | | |

| | $SiH_4$ | $H_2$ | $PH_3$ (diluted with 2% H) | $BF_3$ (diluted with 2% H) | RF | VHF | Pressure (Pa) | Substrate temperature (° C.) | Film thickness (nm) |
|---|---|---|---|---|---|---|---|---|---|
| n1 | 20 | 100 | 30 | | 50 | | 350 | 250 | 20 |
| i1 | 100 | 5000 | | | | 400 | 350 | 250 | 2000 |
| p1 | 10 | 800 | | 100 | 300 | | 350 | 200 | 10 |

TABLE 3

| | $SiH_4$ | $H_2$ | $PH_3$ (diluted with 2% H) | $BF_3$ (diluted with 2% H) | RF | VHF | Pressure (Pa) | Substrate temperature (° C.) | Film thickness (nm) |
|---|---|---|---|---|---|---|---|---|---|
| n2 | 20 | 100 | 50 | | 50 | | 250 | 250 | 20 |
| i2 | 300 | 3000 | | | | 100 | 250 | 250 | 500 |
| p2 | 10 | 800 | | 100 | 300 | | 250 | 200 | 7 |

TABLE 4

| | $SiH_4$ | $H_2$ | $PH_3$ (diluted with 2% H) | $BF_3$ (diluted with 2% H) | RF | VHF | Pressure (Pa) | Substrate temperature (° C.) | Film thickness (nm) |
|---|---|---|---|---|---|---|---|---|---|
| p2 | 10 | 800 | | 100 | 300 | | 250 | 200 | 3 |
| n2 | 20 | 100 | 50 | | 50 | | 250 | 250 | 20 |
| i2 | 300 | 3000 | | | | 100 | 250 | 250 | 500 |
| p2 | 10 | 800 | | 100 | 300 | | 250 | 200 | 7 |

TABLE 5

|  | Photoelectric conversion efficiency (average value) | Variation in photoelectric conversion efficiency | Peeling |
|---|---|---|---|
| Example 1-A | ○ | ○ | ○ |
| Example 1-B | ○ | ○ | ○ |
| Example 1-C | ○ | ○ | ○ |
| Comparative Example 1-A |  |  | ○ |
| Comparative Example 1-B |  | ○ |  |

○: No reduction of 1% or more with respect to photoelectric conversion efficiency (average value)
○: Standard deviation of 0.01 or less with respect to variation in photoelectric conversion efficiency
○: 5 or smaller squares where a tape is peeled

TABLE 6

|  | Photoelectric conversion efficiency (average value) | Variation in photoelectric conversion efficiency | Peeling |
|---|---|---|---|
| Example 1-A | ○ | ○ | ○ |
| Example 1-B | ○ | ○ | ○ |
| Example 1-C | ○ | ○ | ○ |
| Comparative Example 1-A |  |  | ○ |
| Comparative Example 1-B |  | ○ |  |

○: No reduction of 1% or more with respect to photoelectric conversion efficiency (average value)
○: Standard deviation of 0.01 or less with respect to variation in photoelectric conversion efficiency
○: 5 or smaller squares where a tape is peeled

What is claimed is:

1. A method of forming a semiconductor device that has a plurality of pin junctions, the plurality of pin junctions comprising silicon films formed on a substrate using a radio-frequency plasma CVD method, the method of forming a semiconductor device comprising, in sequence:
   a first formation step for forming a first semiconductor layer;
   a covering step for covering a surface of the first semiconductor layer with a member having a water content of 0.01 to 0.5 wt % such that the member and the surface of the first semiconductor layer contact each other;
   a removing step for removing the member; and
   a second formation step for forming a second semiconductor layer on the first semiconductor layer.

2. The method of forming a semiconductor device according to claim 1, wherein the member is brought into contact with the surface of the first semiconductor layer at a pressure of 10 $g/cm^2$ to 100 $g/cm^2$.

3. The method of forming a semiconductor device according to claim 1, wherein the surface of the first semiconductor layer has a higher temperature in the covering step than a temperature of the surface of the first semiconductor layer in the removing step, and the temperature of the surface of the first semiconductor layer is gradually decreased between the covering step and the removing step.

4. The method of forming a semiconductor device according to claim 1, further comprising a keeping step for keeping in the air the substrate on which the first semiconductor layer has been formed and the surface of the first semiconductor layer has been covered with the member, at at least a part between the covering step and the removing step.

5. The method of forming a semiconductor device according to claim 1, further comprising a keeping step for keeping in a dry nitrogen atmosphere the substrate on which the first semiconductor layer has been formed and the surface of the first semiconductor layer has been covered with the member.

6. The method of forming a semiconductor device according to claim 1, further comprising a keeping step for keeping in an airtight space the substrate on which the first semiconductor layer has been formed and the surface of the first semiconductor layer has been covered with the member.

7. The method of forming a semiconductor device according to claim 1, wherein the member is formed of nonwoven cloth.

8. The method of forming a semiconductor device according to claim 1, wherein the first semiconductor layer is formed of a semiconductor having one conductivity type and the second semiconductor layer is formed of a semiconductor having another conductivity type different from the one conductivity type.

9. The method of forming a semiconductor device according to claim 1, wherein the first semiconductor layer and the second semiconductor layer are formed of semiconductors having the same conductivity type.

10. The method of forming a semiconductor device according to claim 1, wherein the radio-frequency plasma CVD method comprises a roll to roll method.

* * * * *